United States Patent
Sun et al.

(10) Patent No.: US 8,349,146 B2
(45) Date of Patent: Jan. 8, 2013

(54) METHOD FOR MANUFACTURING NICKEL SILICIDE NANO-WIRES

(75) Inventors: Hai-Lin Sun, Fullerton, CA (US);
Kai-Li Jiang, Fullerton, CA (US);
Qun-Qing Li, Fullerton, CA (US);
Shou-Shan Fan, Fullerton, CA (US)

(73) Assignees: Tsinghua University, Beijing (CN);
Hon Hai Precision Industry Co., Ltd., New Taipei (TW)

(*) Notice: Subject to any disclaimer, the term of this patent is extended or adjusted under 35 U.S.C. 154(b) by 1076 days.

(21) Appl. No.: 12/291,299

(22) Filed: Nov. 6, 2008

(65) Prior Publication Data
US 2009/0258163 A1     Oct. 15, 2009

(30) Foreign Application Priority Data
Apr. 9, 2008  (CN) .......................... 2008 1 0066522

(51) Int. Cl.
*C23C 14/10* (2006.01)
(52) U.S. Cl. ......... 204/192.23; 204/192.12; 204/192.15; 204/192.17
(58) Field of Classification Search ............ 204/192.12, 204/192.15, 192.23, 192.25, 192.17
See application file for complete search history.

(56) References Cited

U.S. PATENT DOCUMENTS
5,203,798 A * 4/1993 Watanabe et al. ............. 134/184
2006/0019471 A1   1/2006 Choi

FOREIGN PATENT DOCUMENTS
CN           1734733           2/2006

OTHER PUBLICATIONS
Lee et al., Direct growth of amorphous silica nanowires by solid state transformation of SiO2 films, Chemical Physics Letters, V.383, p. 380-384, 2004.
Kim et al., Spontaneous nickel monosilicide nanowire formation by metal induced growth, Thin Solid Films, V.483, p. 60-62, 2005.

* cited by examiner

*Primary Examiner* — Keith Hendricks
*Assistant Examiner* — Jason M Berman
(74) *Attorney, Agent, or Firm* — Altis Law Group, Inc.

(57) ABSTRACT

A method for making nickel silicide nano-wire, the method includes the following steps. Firstly, providing a silicon substrate and a growing device, and the growing device including a reacting room. Secondly, forming a silicon dioxide layer on a surface of the silicon substrate. Thirdly, forming a titanium layer on the silicon dioxide layer. Fourthly, placing the silicon substrate into the reacting room, and heating the reacting room to a temperature of 500~1000° C. Finally, forming a plurality of nickel cluster onto the surface of the silicon substrate.

19 Claims, 5 Drawing Sheets

METHOD FOR MANUFACTURING NICKEL SILICIDE NANO-WIRES

BACKGROUND

1. Technical Field

The present invention relates to methods for making nano materials and, particularly, to a method for making a nickel silicide (NiSi) nano-wires.

2. Discussion of Related Art

Nickel silicide is promising for use as a new interconnecting material due to its low electrical resistivity and high thermal stability. Therefore, achieving various shapes of nickel silicide nano materials is desirable.

A conventional method for making nickel silicide nano-wires includes the following steps. Firstly, providing a silicon wafer as growing substrate. Secondly, forming a layer of catalyst on the silicon wafer. Thirdly, putting the silicon wafer in to a furnace and introducing a silicon-containing gas therein. Fourthly, heating the furnace to a temperature of 500~1100° C. to fabricate silicon silicon nano-wires. Fifthly, depositing a layer of nickel on the silicon nano-wires. Finally, controlling the temperature of furnace to 550° C. to achieve nickel silicide nano-wires.

However, there are some drawbacks in using this method. Firstly, silicon-containing gas is harmful to the environment. Secondly, the method cannot control the diameter of the nickel silicide nano-wires. Thirdly, it is a time-consuming method.

What is needed, therefore, is an efficient method for making the nickel silicide nano-wire that is environmental friendly.

BRIEF DESCRIPTION OF THE DRAWINGS

Many aspects of the present method for making the nickel silicide nano-wire can be better understood with references to the following drawings. The components in the drawings are not necessarily drawn to scale, the emphasis instead being placed upon clearly illustrating the principles of the present method for making the nickel silicide nano-wire.

Figure 1:
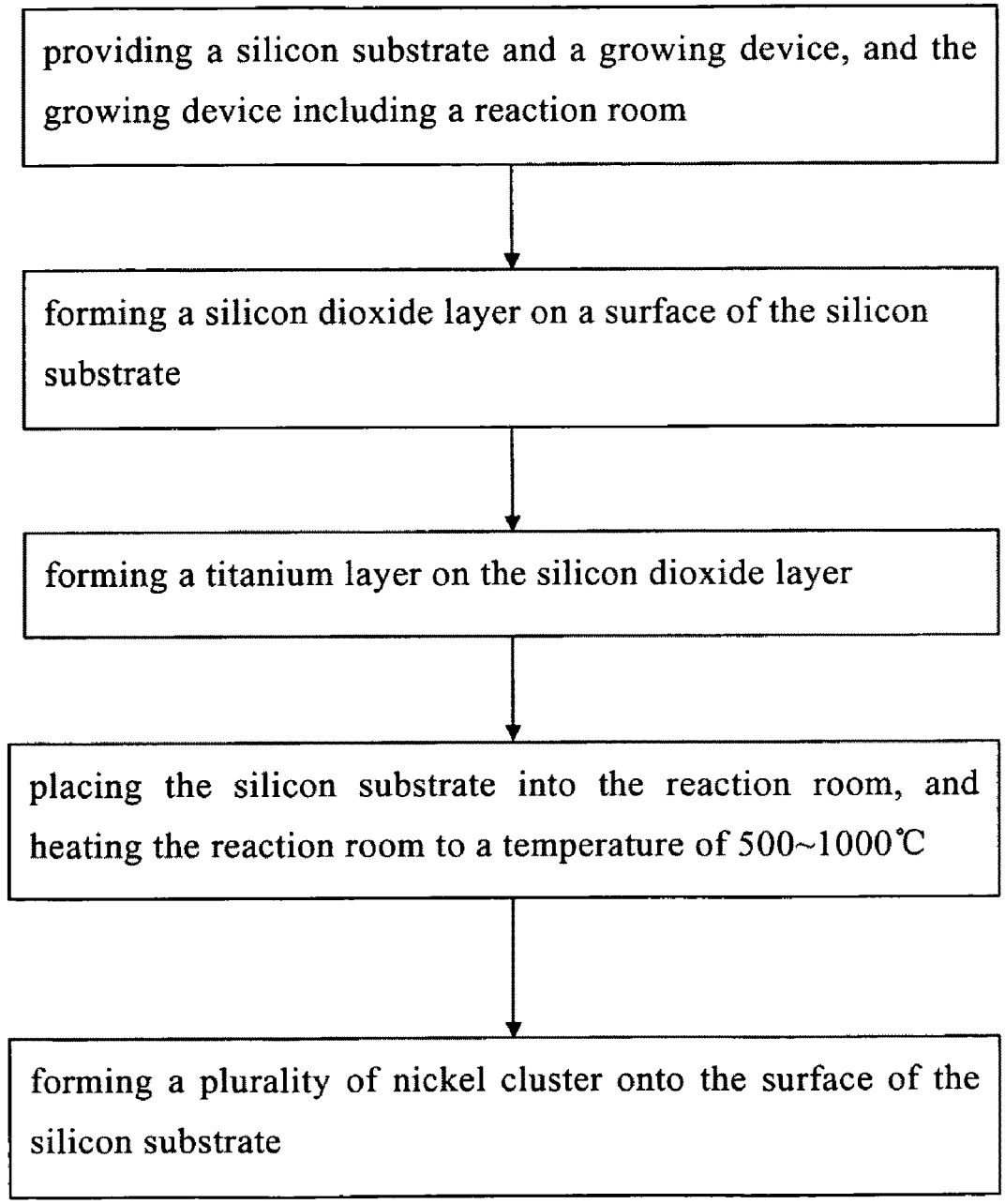
FIG. 1 is a flow chart of a method for making a nickel silicide nano-wire, in accordance with a present embodiment.

Corresponding reference characters indicate corresponding parts throughout the several views. The exemplifications set out herein illustrate at least one embodiment of the present method for making the nickel silicide nano-wire, in at least one form, and such exemplifications are not to be construed as limiting the scope of the invention in any manner.

DETAILED DESCRIPTION

References will now be made to the drawings to describe, in detail, various embodiments of the present method for making a nickel silicide nano-wire.

Figure 2:
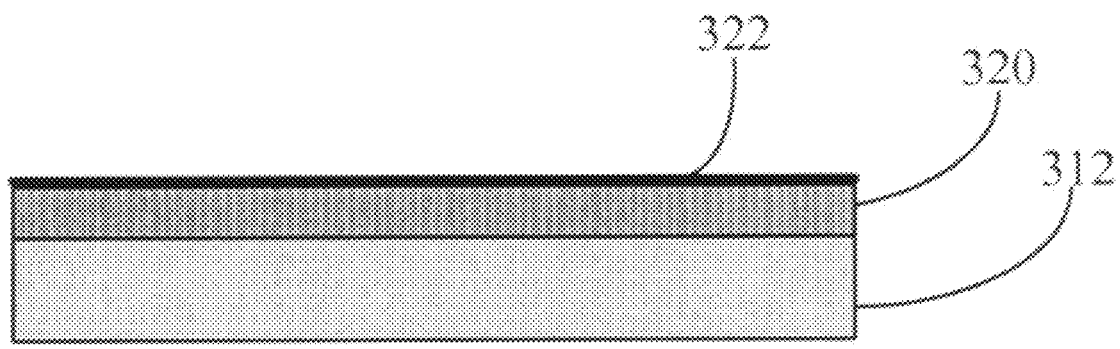
FIG. 2 is a schematic view of a silicon substrate formed with a silicon dioxide layer and a titanium layer used for making the nickel silicide nano-wire of FIG. 1.
Figure 3:
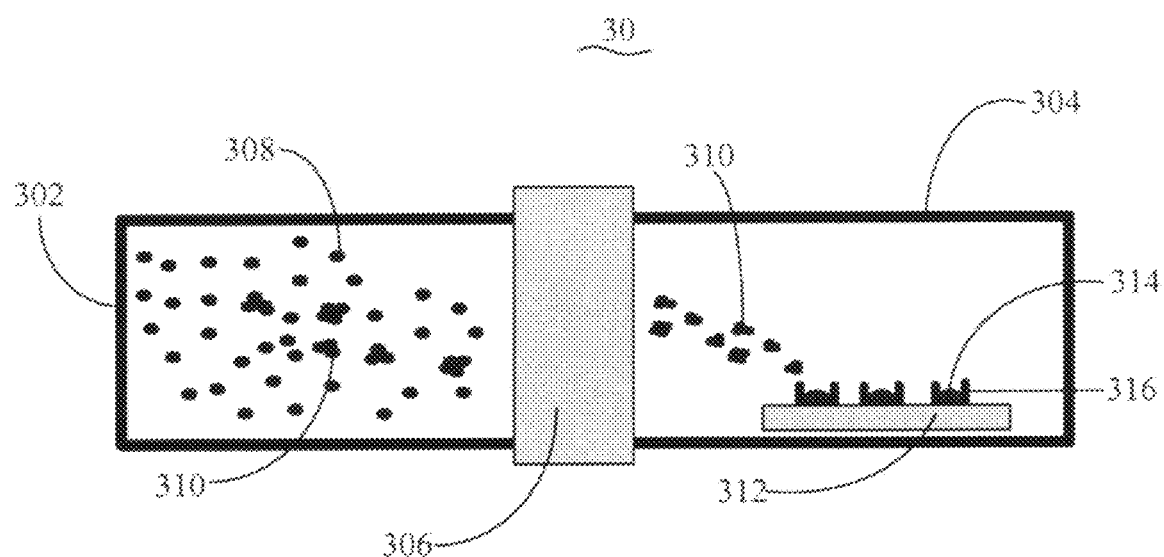
FIG. 3 is a schematic view of a growing device used for making the nickel silicide nano-wire of FIG. 1.

Referring to FIGS. 1, 2 and 3, a method for making the nickel silicide nano-wire 316 according to the present embodiment includes the following steps: (a) providing a silicon substrate 312 and a growing device 30 that includes a reacting room 304; (b) forming a silicon dioxide layer 320 on a surface of the silicon substrate 312; (c) forming a titanium layer 322 on the silicon dioxide layer 320; (d) placing the silicon substrate 312 into the reacting room 304, and heating the reacting room 304 to a temperature of 500~1000° C.; and (e) forming a plurality of nickel clusters 310 on the surface of the silicon substrate 312.

In step (a), the silicon substrate 312 is a silicon wafer. The size and shape of the silicon substrate 312 is arbitrary and can be selected according to need. The silicon substrate 312 is cleaned by ultrasonic vibration before forming a silicon dioxide layer 320 thereon. The period of time for cleaning the silicon substrate 312 ranges from approximately 5 to 10 minutes.

In step (a), the growing device 30 further includes a sputtering device (not shown). The sputtering device includes a sputtering room 302. The sputtering room 302 is intercommunicated with the reacting room 304 via a quadrupole mass spectrometer 306. The sputtering device is used to provide Ni particles. In the present embodiment, the sputtering device is a Magnetron Sputtering Device. The growing device 30 further includes a heating device (not shown) to heat the reacting room 304 and a vacuumization system (not shown) to vacuumize the reacting room 304.

In step (b), the silicon dioxide layer 320 can be formed via placing the silicon substrate 312 in an oxygenic environment for about 30 to 120 minutes. The thickness of the silicon dioxide layer 320 ranges approximately from 10 nanometers to 1 micrometer. In the present embodiment, the thickness of the silicon dioxide layer 320 is 500 nanometers. It is to be understood that a process of heating the silicon substrate 312 can be carried out to increase the velocity of forming silicon dioxide layer 320.

In step (c), the method for forming the titanium layer 322 can be selected from chemical vapor deposition (CVD), sputtering, and plasma-assisted chemical vapor deposition among other acceptable methods. The thickness of the titanium layer 322 ranges approximately from 1 to 500 nanometers. In the present embodiment, a titanium layer 322 of 50 nanometers is formed on the silicon dioxide layer 320 by sputtering.

In step (d), the silicon substrate 312 can be placed anywhere in the reacting room 304 as long as the nickel cluster 310 introduced in the step (e) can achieve the titanium layer 322. After placing the silicon substrate 312 in the reacting room 304, air pressure in the reacting room 304 is reduced to lower than $1 \times 10^{-3}$ Pa. The rate of temperature increase in the reacting room 304 is controlled to be 10° C. per minute.

In step (d), the reacting room 304 is kept at a temperature between 500~1000° C. for about 2 to 10 minutes. During this time, the silicon dioxide layer 320 reacts with the titanium layer 322 to form a plurality of island-shape titanium silicide ($TiSi_2$) structure 314. A portion of the silicon substrate 312 which is not covered by the island-shape titanium silicide structure 314 is exposed to the environment. The size of the island-shape titanium silicide structure 314 depends on the thickness of the silicon dioxide layer 320 and the titanium layer 322. The size of the island-shape titanium silicide structure 314 will effect the diameter of the nickel silicide nano-wires 316 fabricated in step (e). The bigger the size of the island-shape titanium silicide structure 314 is, the larger the diameter of the nickel silicide nano-wires 316 will be. In the present embodiment, the thickness of the silicon dioxide layer 320 is 500 nanometers, the thickness of the titanium layer 322 is 50 nanometers, and the effective diameter of the island-shape titanium silicide structure 314 ranges approximately from 500 nanometers to 1 micrometer.

Step (e) includes the following substeps of (e1) forming a plurality of nickel clusters 310; (e2) filtering the nickel clusters 310; (e3) depositing the nickel clusters 310 on the silicon substrate 312.

In step (e1), the nickel clusters 310 are formed using the Magnetron Sputtering Device. After a plurality of Ni particles 308 are sputtered out of the Ni target, the Ni particles 308 move freely in the sputtering room 302, collide with each other and aggregate to form a plurality of nickel clusters 310. The working gas in the present embodiment comprises of argon (Ar) gas. The working gas pressure in the sputtering room 302 ranges approximately from $1 \times 10^{-1}$ Pa to $9 \times 10^{-1}$ Pa.

In step (e2), the gas pressure in the sputtering room 302 is higher than the pressure in the reacting room 304. The nickel clusters 310 diffuse from the sputtering room 302 to the reacting room 304 via the quadrupole mass spectrometer 306. The quadrupole mass spectrometer 306 can select the nickel clusters 310 in different mass numbers.

In step (e1), the nickel clusters 310 of a predetermined mass number pass through the quadrupole mass spectrometer 306. The nickel clusters 310 diffuse continuously after getting into the reacting room 304. When the nickel clusters 310 makes contacts with the silicon substrate 312, the nickel clusters 310 deposit thereon and react with the silicon substrate 312 to fabricate nickel silicide nano-wires 316. The mass numbers of the nickel clusters 310 depend on the size of the island-shape titanium silicide structure 314. The bigger the size of the island-shape titanium silicide structure 314 is, the larger the mass number of the nickel clusters 310 should be. The size of the island-shape titanium silicide structure 314 depends on the thickness of the silicon dioxide layer 320 and the titanium layer 322. Therefore, the nickel silicide nano-wires 316 in different diameters can be fabricated by controlling the thickness of the silicon dioxide layer 320, the titanium layer 322 and mass numbers of the nickel clusters 310. The bigger the thickness of the silicon dioxide layer 320 and the titanium layer 322 is, the larger the diameter of the nickel silicide nano-wires 316 will be. The length of the nickel silicide nano-wires 316 depends on the growing time. The greater the growing time is, the longer the nickel silicide nano-wires 316 will be.

Figure 4:
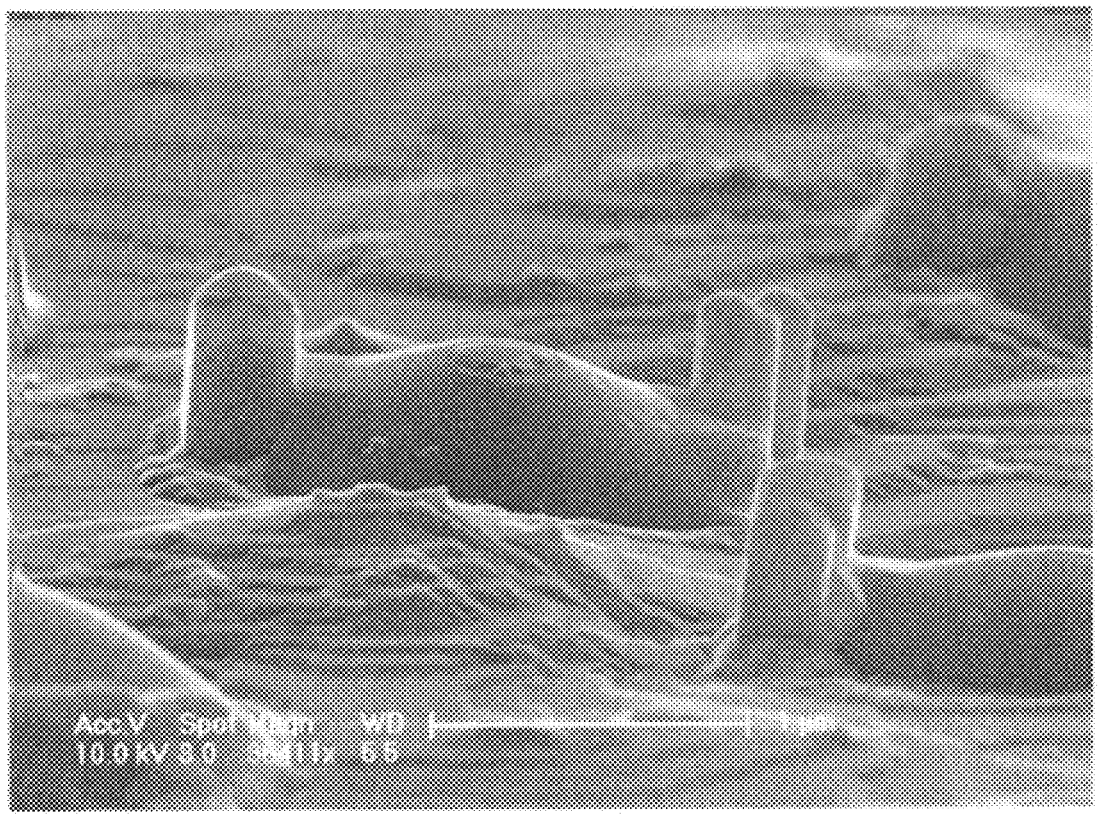
FIGS. 4 and 5 are a Scanning Electron Microscope (SEM) image of the nickel silicide nano-wire formed by the method of FIG. 1.
Figure 5:
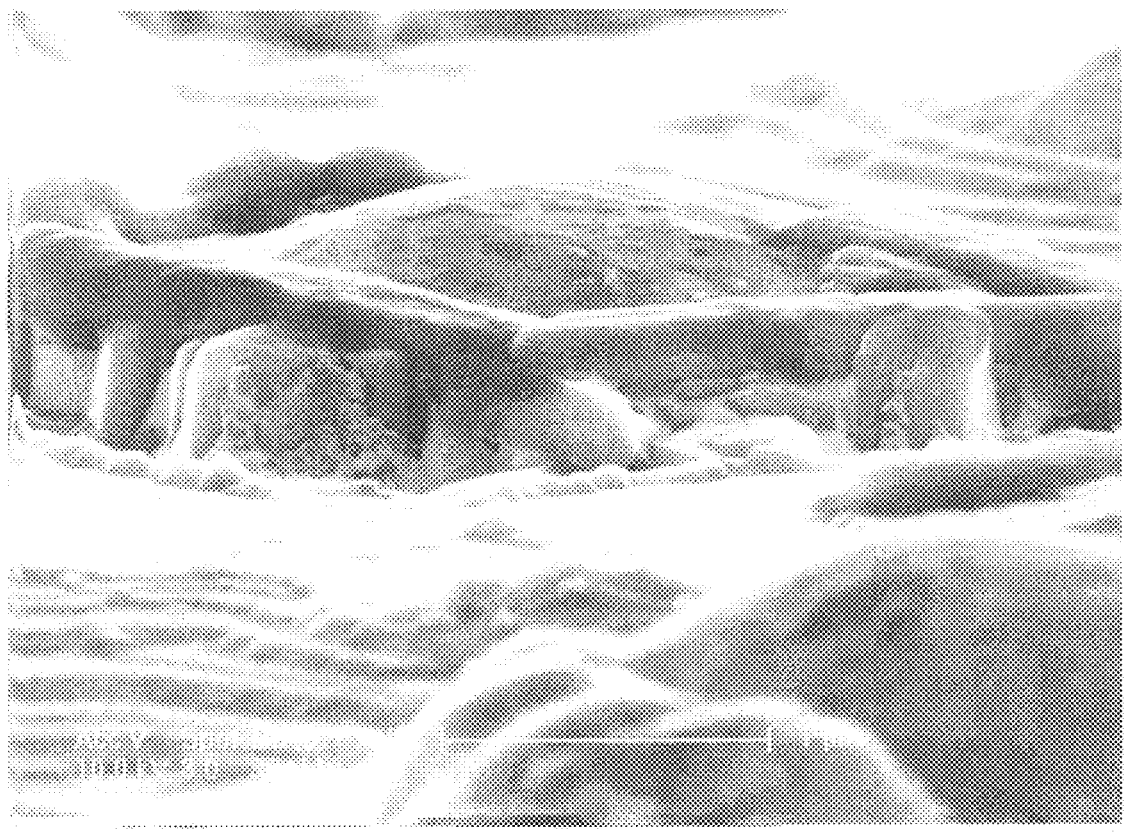

In the present embodiment, the nickel clusters 310 of predetermined mass numbers of 7000~9000 are used to fabricate nickel silicide nano-wires 316. Referring to FIGS. 4 and 5, the nickel silicide nano-wires 316 grow along the side of the island-shape titanium silicide structure 314. The nickel silicide nano-wires 316 can grow perpendicular to or parallel to the surface of the silicon substrate 312. The length of the nickel silicide nano-wires 316 ranges approximately from 100 nanometers to 2 micrometers. The diameter of the nickel silicide nano-wires 316 ranges approximately from 10 to 500 nanometers.

The present method for making the nickel silicide nano-wires has many advantages including the following. Firstly, the nickel clusters 310 are directly formed on the silicon substrate to fabricate nickel silicide nano-wires, thereby simplifying the process and reducing costs. Secondly, there is no need for silicon-containing gas; thereby the present method is environmental friendly. Thirdly, diameters of the nickel silicide nano-wires are controllable.

It is to be understood that the above-described embodiments are intended to illustrate, rather than limit, the invention. Variations may be made to the embodiments without departing from the spirit of the invention as claimed. The above-described embodiments illustrate the scope of the invention but do not restrict the scope of the invention.

It is also to be understood that the above description and the claims drawn to a method may include some indication in reference to certain steps. However, the indication used is only to be viewed for identification purposes and not as a suggestion as to an order for the steps.

What is claimed is:

1. A method for making nickel silicide nano-wire, the method comprising the following steps of:
   (a) providing a silicon substrate and a growing device, and the growing device comprises a reacting room, a sputtering device and a quadrupole mass spectrometer, wherein the sputtering device comprises a sputtering room and the sputtering room is intercommunicated with the reacting room via the quadrupole mass spectrometer;
   (b) forming a silicon dioxide layer on a surface of the silicon substrate;
   (c) creating a titanium layer on the silicon dioxide layer;
   (d) placing the silicon substrate into the reacting room, and heating the reacting room to a temperature of 50~1000° C.; and
   (e) supplying a plurality of nickel cluster onto the surface of the silicon substrate.

2. The method as claimed in claim 1, wherein the silicon substrate is a silicon wafer.

3. The method as claimed in claim 1, wherein the silicon substrate is cleaned by ultrasonic vibration before the step (b).

4. The method as claimed in claim 1, wherein the silicon dioxide layer is formed via placing the silicon substrate in an environment comprising of oxygen.

5. The method as claimed in claim 4, wherein step (b) further comprising heating the silicon substrate.

6. The method as claimed in claim 1, wherein the thickness of the silicon dioxide layer ranges from 10 nanometers to 1 micrometer.

7. The method as claimed in claim 1, wherein the method for forming the titanium layer can be selected from a group comprising chemical vapor deposition, sputtering, and plasma-assisted chemical vapor deposition.

8. The method as claimed in claim 1, wherein the thickness of the titanium layer ranges from 1 to 500 nanometers.

9. The method as claimed in claim 1, wherein in step (d) the air pressure of the reacting room is lower than $1 \times 10^{-3}$ Pa.

10. The method as claimed in claim 1, wherein in step (d) the temperature increases in the reacting room at a rate of about 10° C. per minute.

11. The method as claimed in claim 1, wherein the reacting room is kept at the temperature of 500~1000° C. for about 2 to 10 minutes before the step (e).

12. The method as claimed in claim 1, wherein the sputtering device is a Magnetron Sputtering Device.

13. The method as claimed in claim 12, wherein the step (e) comprises the following substeps of:
   (e1) forming a plurality of nickel clusters;
   (e2) filtering the nickel clusters; and
   (e3) depositing the nickel cluster filtrate on the silicon substrate.

14. The method as claimed in claim 13, wherein in step (e1), the nickel clusters are formed using the Magnetron Sputtering Device.

15. The method as claimed in claim 14, wherein the working gas of the Magnetron Sputtering Device comprises of argon gas.

16. The method as claimed in claim 14, wherein the working gas pressure in the sputtering room ranges from $1 \times 10^{-1}$ Pa to $9 \times 10^{-1}$ Pa.

17. The method as claimed in claim 13, wherein in step (e2) the gas pressure in the sputtering room is greater than the pressure in the reacting room.

18. The method as claimed in claim 13, wherein in step (e2) the nickel clusters are filtrated by the quadrupole mass spectrometer.

19. The method as claimed in claim 13, wherein in step (e3) the nickel clusters deposited on the silicon substrate have a predetermined mass numbers in the range of 7000~9000.

* * * * *